United States Patent
Im et al.

(10) Patent No.: US 7,729,184 B2
(45) Date of Patent: Jun. 1, 2010

(54) MEMORY DEVICE HAVING FUNCTION OF DETECTING BIT LINE SENSE AMP MISMATCH

(75) Inventors: Jae-Hyuk Im, Kyoungki-do (KR); Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 124 days.

(21) Appl. No.: 11/647,631

(22) Filed: Dec. 29, 2006

(65) Prior Publication Data

US 2008/0056040 A1    Mar. 6, 2008

(30) Foreign Application Priority Data

Sep. 6, 2006    (KR) .................... 10-2006-0085611

(51) Int. Cl.
G11C 7/00    (2006.01)
G11C 7/02    (2006.01)

(52) U.S. Cl. .................. 365/201; 365/205; 365/207; 365/208

(58) Field of Classification Search .............. 365/201, 365/205, 207, 208, 203
See application file for complete search history.

(56) References Cited

U.S. PATENT DOCUMENTS

| | | | |
|---|---|---|---|
| 5,396,464 A * | 3/1995 | Slemmer | 365/201 |
| 5,517,451 A * | 5/1996 | Okuzawa | 365/201 |
| 5,825,699 A * | 10/1998 | Tanaka | 365/207 |
| 6,111,796 A * | 8/2000 | Chang et al. | 365/207 |
| 6,389,563 B1 * | 5/2002 | Oh et al. | 365/207 |
| 6,538,944 B2 * | 3/2003 | Choi | 365/207 |
| 6,853,593 B1 * | 2/2005 | Bae | 365/205 |
| 7,082,068 B2 * | 7/2006 | Im et al. | 365/201 |
| 7,116,604 B2 * | 10/2006 | Nakagawa | 365/201 |
| 7,130,236 B2 * | 10/2006 | Rajwani et al. | 365/207 |
| 7,266,030 B2 * | 9/2007 | Do et al. | 365/207 |
| 7,283,412 B2 * | 10/2007 | Do | 365/205 |
| 7,362,631 B2 * | 4/2008 | Jang | 365/201 |
| 7,382,671 B2 * | 6/2008 | Lee | 365/205 |
| 7,450,453 B2 * | 11/2008 | Do | 365/205 |

FOREIGN PATENT DOCUMENTS

| | | |
|---|---|---|
| KR | 1998-060583 | 10/1998 |
| KR | 2001-0005031 | 1/2001 |
| KR | 2003-0008051 | 1/2003 |
| KR | 10-2005-0112204 | 11/2005 |

* cited by examiner

*Primary Examiner*—Trong Phan
(74) *Attorney, Agent, or Firm*—Blakely, Sokoloff, Taylor & Zafman

(57) ABSTRACT

Provided is a memory device that can detect a mismatch in a bit line sense amp, wherein the memory device includes a sense amp drive unit for selectively supplying a pull-up drive voltage or a pull-down drive voltage to a bit line sense amp in response to a sensing test signal provided from outside.

8 Claims, 8 Drawing Sheets

MEMORY DEVICE HAVING FUNCTION OF DETECTING BIT LINE SENSE AMP MISMATCH

CROSS-REFERENCE TO RELATED APPLICATION

The present invention claims priority of Korean patent application number 10-2006-0085611, filed on Sep. 6, 2006, which is incorporated by reference in its entirety.

BACKGROUND OF THE INVENTION

The present invention relates to a memory device; and, more particularly, to a memory device that can detect a mismatch in a bit line sense amp amplifying a potential difference between a pair of bit lines.

Basically, a memory device reads and writes data required by external devices. A basic unit for storing data is called a "cell," and the memory device has one capacitor for storing one data. In order to read the data stored in the capacitor and to accurately transfer it outside, it is necessary to accurately decide polarity of data stored in the cell. To this end, the memory device is provided with a bit line sense amp as a device for deciding/amplifying data.

FIG. 1 is a circuit diagram for describing the concept of a cell array and a bit line sense amp according to the prior art. Word lines (WL1, WL2 and WL3), bit line separation signals (BISH and BISL) and a bit line equalization signal BLEQ are illustrated in FIG. 1.

Normally, a pair of bit lines BL and /BL connected to the bit line sense amp is precharged to a same voltage level. Then, when a first word line WL1 is enabled, a cell transistor 101 connected to the first word line WL is turned on, and data charged in a capacitor 102 flows through a channel of the cell transistor 101 to the bit line BL (this is called "charge sharing"). At this time, the negative bit line /BL maintains the precharge voltage VBLP level, and only an electric potential on the positive bit line BL is changed through charge sharing.

On the other hand, as well-known in the art, the bit line sense amp 103 serves to recognize a potential difference between both ends of the positive bit line BL and the negative bit line /BL, and to fully amplify a high electric potential to an even higher electric potential and to fully amplify a low electric potential to an even lower electric potential (this is also called "sensing").

Ideally, the bit line sense amp 103 should be able to accurately sense even a small potential difference between both ends of the bit line pair BL and /BL, and amplify it. However, this is not so in reality. A potential difference dV(delta V) between both ends of the bit line pair BL and /BL enough to do the sensing operation is called an offset voltage of the bit line sense amp. If the potential difference between both ends of the bit line pair BL and /BL is not higher than the offset voltage, it is not guaranteed that the bit line sense amp 103 could perform an accurate sensing operation. One of the factors that cause such an offset voltage is a mismatch in the bit line sense amp 103. That is, a latch PMOS pair and a latch NMOS pair in the bit line sense amp 103 responsible for sensing should be fabricated identically as cross-coupled pairs, but their layout is not exactly symmetric in reality. Also, even if the layout is symmetric somehow, their patterns are not formed identically. In addition, a contact is not always defined in the same way. Because of these problems, a mismatch inevitably exists in the bit line sense amp 103.

FIG. 2 is a block diagram illustrating a bit line sense amp and a sense amp drive unit according to the prior art.

The sense amp drive unit 210 has a role of controlling the bit line sense amp 220 to start and stop sensing in response to an external command, and is provided with a sense amp controller 230 and a sense amp driver 240. A power-up signal PWEUP, a precharge pulse PCGP, a bit line equalization signal BLEQ, bit line pairs (BL u, /BL u, BL d and /BL d) and bit line separation signals(BISH and BISL) are illustrated in FIG. 2.

FIG. 3 shows a detailed circuit diagram of the sense amp controller 230 according to the prior art.

The sense amp controller 230 is a part that applies a pull-up drive signal RTOEN and a pull-down drive signal SBEN to the sense amp driver 240 in response to signals provided from outside. Its operation will now be explained with reference to FIG. 3.

When an Active command is inputted and an active pulse ACTP goes HIGH, the active pulse ACTP is inverted by an inverter I1. Then, a LOW voltage is fed to the gate of a transistor P1, so that the transistor P1 is turned on and a node a becomes a HIGH state. The HIGH voltage at the node a is latched and inverted by inverters I3 and I4 having input and output terminals interlocked to each other, thereby making a voltage at a node b in a LOW state. Further, the voltage of the node b is inverted by each of inverters I5 and I6, so that the pull-up drive signal RTOEN and the pull-down signal SBEN are outputted at HIGH states, respectively.

Thereafter, when a precharge command is inputted and a precharge pulse PCGP goes HIGH, the transistor N1 is turned on, the node a becomes a LOW state, and the pull-up drive signal RTOEN and the pull-down drive signal SBEN become a LOW state, respectively.

In FIG. 3, a power-up signal PWRUP is a signal for keeping initial values of the pull-up drive signal RTOEN and of the pull-down drive signal SBEN in LOW states; delay circuits 301 and 302 and switches connected thereto are for controlling a start time of the pull-up drive signal RTOEN and the pull-down drive signal SBEN. These signals are not necessarily related to the present invention. An external voltage VDD, a ground voltage VSS, and a transistor N2 are illustrated in FIG. 3.

FIG. 4 provides a detailed circuit diagram of the sense amp driver 240 according to the prior art.

The sense amp driver 240 serves to receive the pull-up drive signal RTOEN and the pull-down drive signal SBEN from the sense amp controller 230, and supply a pull-up drive voltage RTO and a pull-down drive voltage SB to the bit line sense amp 220. And, a core voltage VCORE is illustrated in FIG. 4. An operation thereof will now be described with reference to FIG. 4.

During the precharge operation, a Bit Line EQualizing (BLEQ) signal becomes a HIGH state, and makes the RTO and SB nodes to a bit line precharge voltage VBLP. However, when the Active command is inputted, the BLEG signal becomes a LOW state. In result, the RTO and SB nodes are separated from each other; and when the signals RTOEN and the SBEN are inputted from the sense amp controller 230, the transistors T1 and T2 are turned on and the RTO node becomes a core voltage VCORE while the SB node become a ground voltage, to thereby drive the bit line sense amp 220.

As described above, because the conventional sense amp drive unit 210 simultaneously feeds the pull-up drive voltage RTO and the pull-down drive voltage SB to the bit line sense amp 220 during an active operation, a sensing operation occurs simultaneously by the NMOS transistor pair and the PMOS transistor pair in the bit line sense amp 220. Therefore, if an error occurs during a read operation, it is hard to find out whether the error is caused by a mismatch in the NMOS transistors or by a mismatch in the PMOS transistors.

SUMMARY OF THE INVENTION

It is, therefore, an object of the present invention to provide a memory device that can detect whether an error during a read operation is caused by a mismatch in NMOS transistors or by a mismatch in PMOS transistors in a bit line sense amp.

In accordance with the present invention, there is provided a memory device capable of detecting a mismatch in a Bit Line Sense Amp mismatch comprising a sense amp drive unit that selectively supplies a pull-up drive voltage or a pull-down drive voltage to the bit line sense amp according to an externally applied sensing test signal.

Preferably, the memory device can include the sense amp drive unit that does not supply the pull-down drive voltage when a pull-up sensing signal that is one of sensing test signals is inputted and that does not supply the pull-up drive voltage when a pull-down sensing signal that is the one of the sensing test signals is inputted; and the bit line sense amp for amplifying a potential difference between a pair of bit lines by using the drive voltage supplied from the sense amp drive unit.

Preferably, the sense amp drive unit includes: a sense amp controller that does not output a pull-down drive signal when the pull-up sensing signal is inputted and that does not output a pull-up drive signal when the pull-down sensing signal is inputted; and a sense amp driver that supplies the pull-up drive voltage when the pull-up drive signal is inputted and the pull-down drive voltage when the pull-down drive signal is inputted.

The other objectives and advantages of the invention will be understood by the following description and will also be appreciated by the embodiments of the invention more clearly. Further, the objectives and advantages of the invention will readily be seen that they can be realized by the means and its combination specified in the claims.

DESCRIPTION OF SPECIFIC EMBODIMENTS

Hereinafter, preferred embodiments of the present invention will be set forth in detail with reference to the accompanying drawings so that a person skilled in the art can easily carry out the invention.

Figure 5:
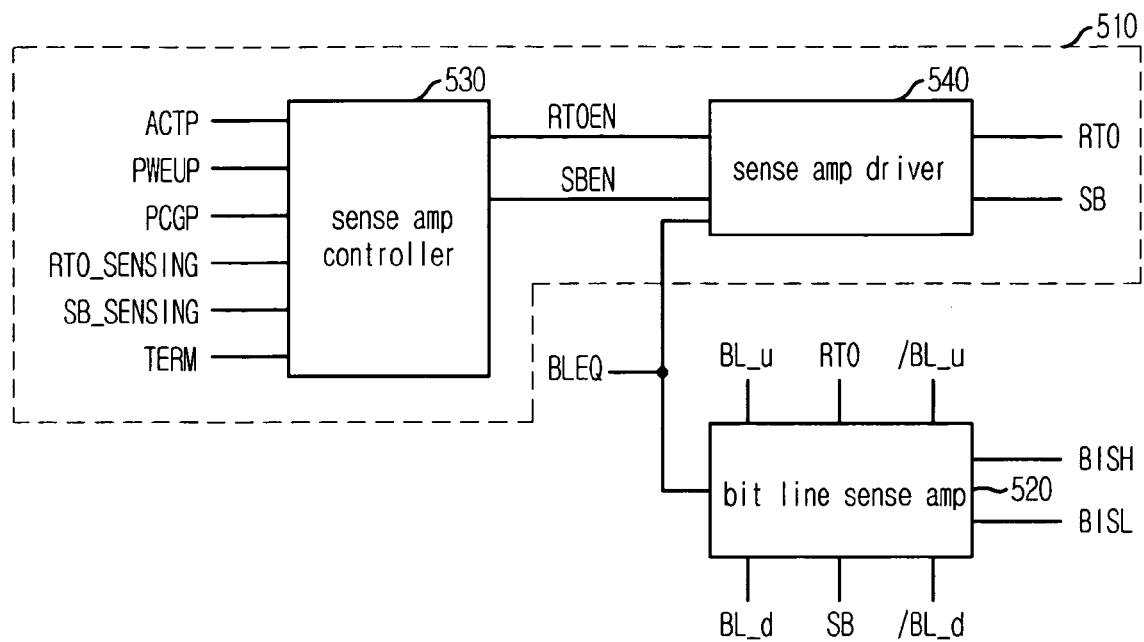
FIG. 5 is a block diagram of a memory device that can detect a mismatch in a bit line sense amp in accordance with a preferred embodiment of the present invention.

FIG. 5 illustrates a block diagram of a memory device capable of detecting a mismatch in a bit line sense amp in accordance with a preferred embodiment of the present invention. A power-up signal PWEUP, a precharge pulse PCGP, a termination signal TERM, bit line pairs (BL u, /BL u, DL d and /BL d) and bit line separation signals(BISH and BISL) are illustrated in FIG. 5.

The memory device shown in FIG. 5 is characterized in that a sense amp drive unit 510 selectively supplies a pull-up drive voltage RTO or a pull-down drive voltage SB to a bit line sense amp 520 in response to a sensing test signal provided from outside. That is, the memory device includes the sense amp drive unit 510 which does not feed the pull-down drive voltage SB when a pull-up sensing signal RTO_SENSING is applied, and which does not feed the pull-up drive voltage RTO when a pull-down sensing signal SB_SENSING is applied; and the bit line sense amp 520 which amplifies a potential difference of a bit line pair by using a drive voltage supplied from the sense amp drive unit 510.

Figure 4:
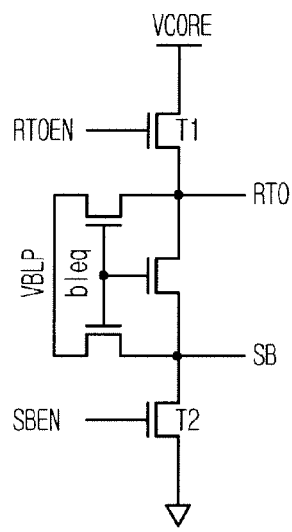
FIG. 4 is a detailed circuit diagram of the conventional sense amp driver shown in FIG. 2.

Further, the sense amp drive unit 510 can be implemented by being provided with a sense amp controller 530 and a sense amp driver 540. In these devices, the sense amp driver 540 has the identical configuration with the conventional sense amp driver described in FIG. 4. Therefore, when a pull-up drive signal RTOEN and a pull-down drive signal SBEN are applied, the sense amp driver 540 feeds the pull-up drive voltage RTO and the pull-down drive voltage SB to the bit line sense amp 520, respectively. The sense amp controller 530 has a slightly different configuration from that of the conventional sense amp controller described before. Namely, the sense amp controller 530 of the present invention is characterized in that it does not output the pull-down drive signal SBEN when the pull-up sensing signal RTO_SENSING is applied, and it does not output the pull-up drive signal RTOEN when the pull-down sensing signal SB_SENSING is applied.

Figure 6:
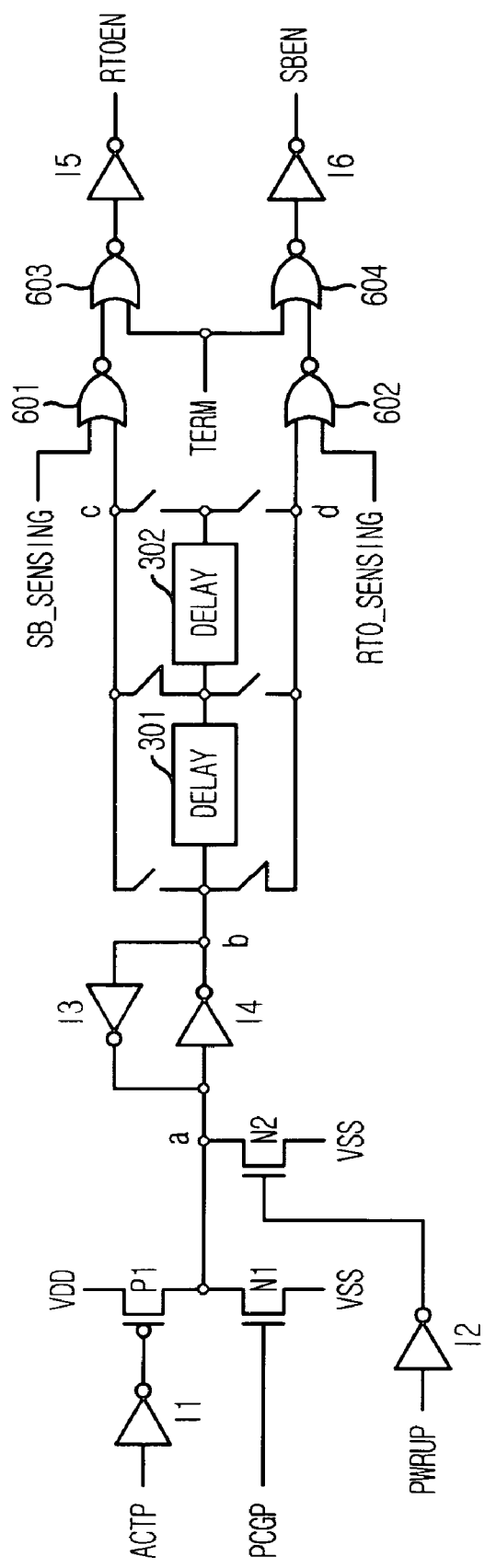
FIG. 6 is a detailed circuit diagram illustrating one example of the sense amp controller depicted in FIG. 5.

FIG. 6 illustrates a detailed circuit diagram of the sense amp controller 530 depicted in FIG. 5. A ground voltage VSS, a transistor N1 and a transistor N2 are illustrated in FIG. 6.

Figure 1:
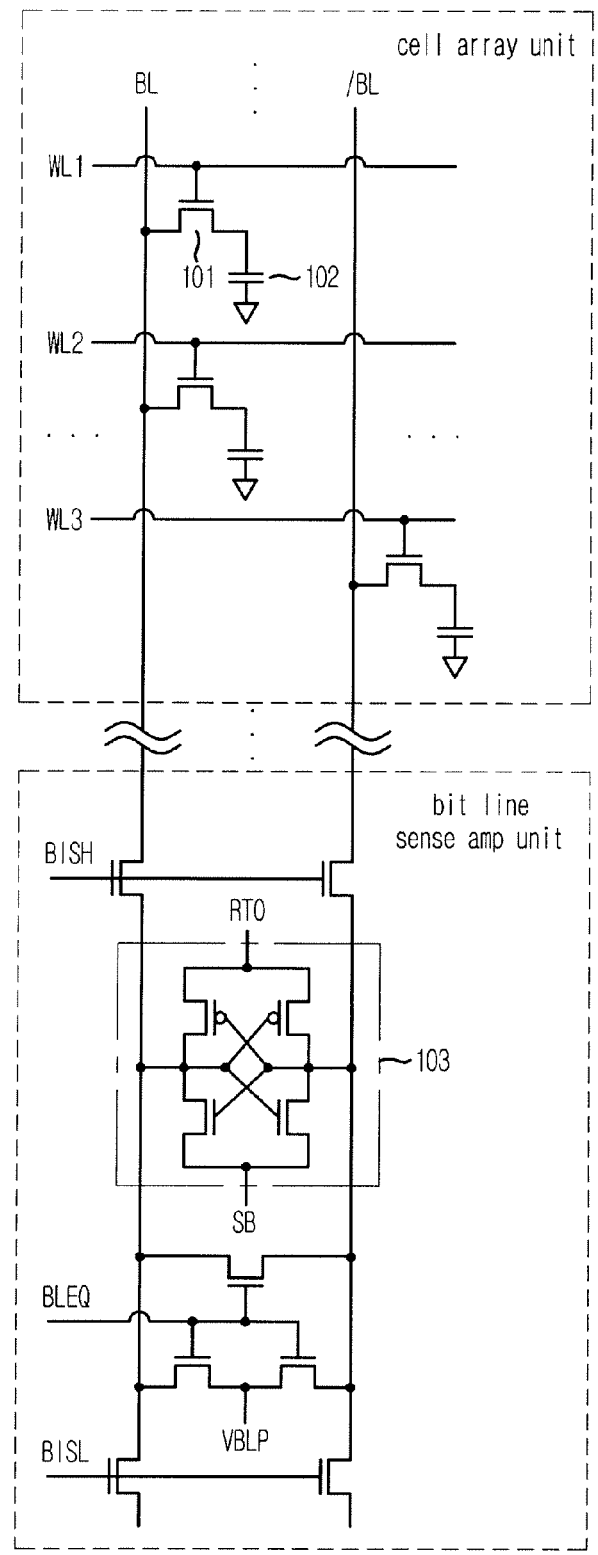
FIG. 1 is a circuit diagram for describing the concept of a cell array and a bit line sense amp according to the prior art.
Figure 2:
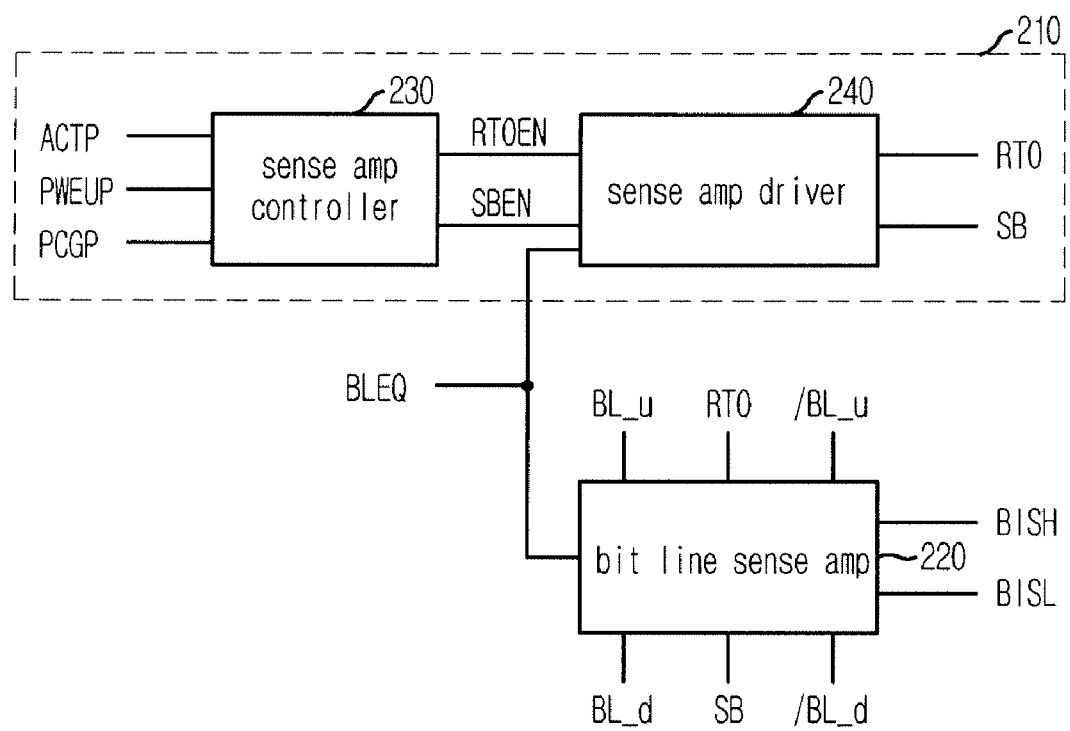
FIG. 2 is a block diagram illustrating a bit line sense amp and a sense amp drive unit according to the prior art.
Figure 3:
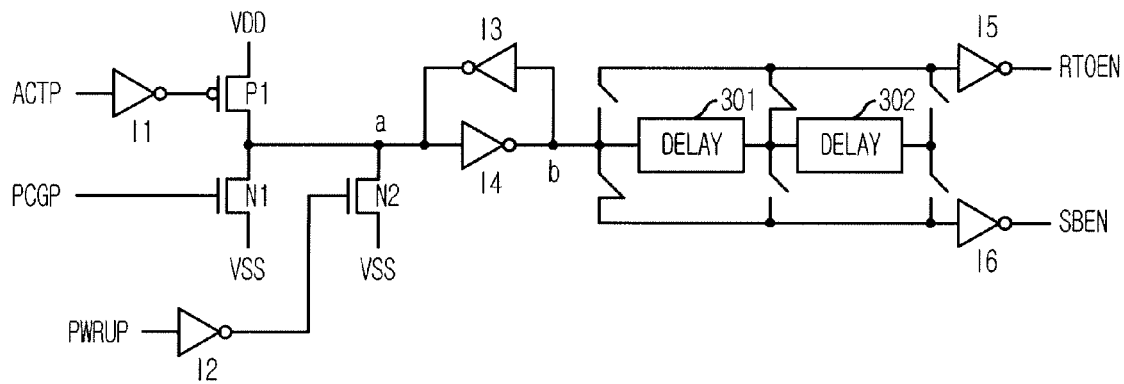
FIG. 3 is a detailed circuit diagram of the conventional sense amp controller shown in FIG. 2.

The sense amp controller illustrated in FIG. 6 further utilizes three signals, i.e., the pull-up sensing signal RTO_SENSING, the pull-down sensing signal SB_SENSING, and a termination signal TERM, in addition to the signals used in the conventional sense amp controller depicted in FIG. 3, and therefore has a different configuration from the conventional one.

As shown in FIG. 6, the sense amp controller of the present invention further includes, in addition to the elements used in the conventional sense amp controller depicted in FIG. 3, a first NOR gate 601 to which a signal on an existing pull-up drive signal carrying line (node c) and the pull-down sensing signal SB_SENSING are inputted; a second NOR gate 602 to which a signal on an existing pull-down drive signal carrying line (node d) and the pull-up sensing signal RTO_SENSING are inputted; a third NOR gate 603 to which an output of the first NOR gate 601 and a termination signal TERM are inputted; and a fourth NOR gate 604 to which an output of the second NOR gate 602 and the termination signal TERM are inputted.

In an operation of the sense amp controller, when all of the pull-up sensing signal RTO_SENSING, the pull-down sensing signal SB_SENSING, and the termination signal TERM are at a LOW state, namely, in a normal operating state, the sense amp controller operates identically with the conventional sense amp controller.

Meanwhile, when the termination signal TERM is not inputted, i.e., LOW and the pull-up sensing signal RTO_SENSING for suppressing the supply of the pull-down drive voltage SB is activated to HIGH, an output of the second NOR gate 602 becomes LOW and an output of the fourth NOR gate 604 becomes HIGH which is then inverted by an inverter I6. In result, the pull-down drive signal SBEN becomes LOW, and thus, the pull-down drive voltage SB is not supplied to the bit line sense amp 520 (this means that SB≠VSS).

When the termination signal TERM is not inputted, i.e., LOW and the pull-down sensing signal SB_SENSING for suppressing the supply of the pull-UP drive voltage RTO is activated to HIGH, an output of the first NOR gate 601 becomes LOW and an output of the third NOR gate 603 becomes HIGH which is then inverted by an inverter I5. In result, the pull-up drive signal SBEN becomes LOW, and thus, the pull-up drive voltage RTO is not supplied to the bit line sense amp 520 (this means that RTO≠VCORE).

When the termination signal TERM is inputted, i.e., HIGH, outputs of the third and fourth NOR gates 603 and 604 become LOW, regardless of whether or not the pull-up sensing signal RTO_SENSING and the pull-down sensing signal SB_SENSING are activated. Thus, both the pull-up drive signal RTOEN and the pull-down drive signal SBEN are outputted at a HIGH state. That is, when the termination signal TERM is inputted, both the pull-up drive voltage RTO and the pull-down drive voltage SB are fed to the bit line sense amp 520.

The sense amp controller may receive the termination signal TERM by separately allocating a test mode signal, but it may also receive the termination signal through a specific PAD that is not associated with the operation of the present invention.

Figure 7:
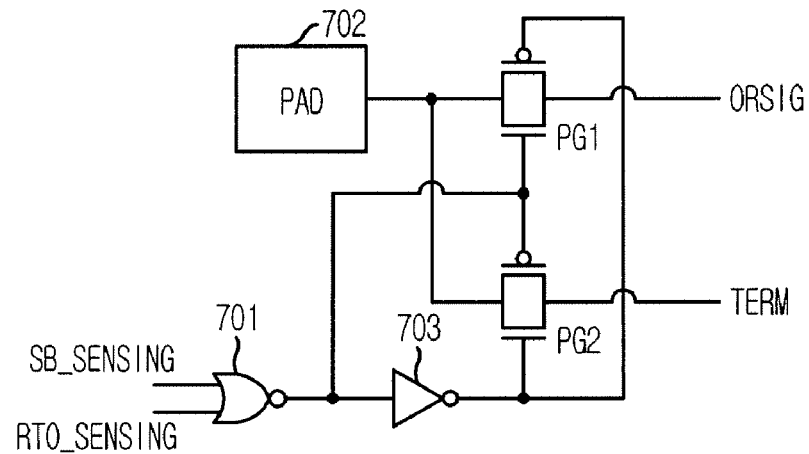
FIG. 7 is a circuit diagram illustrating one example of a termination signal input unit in accordance with the present invention.

FIG. 7 is a circuit diagram illustrating one example of a termination signal input unit used when receiving the termination signal TERM through a specific PAD that is not directly associated with the operation of the present invention.

As shown therein, the termination signal input unit may be provided with a NOR gate 701 to which the pull-down sensing signal SB_SENSING or the pull-up sensing signal RTO_SENSING signal is inputted; a first pass gate PG1 that blocks/opens a path through which an original signal ORSIG that has been inputted to an input pad 702 is sent, and opens the path when an output of the NOR gate 701 is HIGH; and a second pass gate PG2 that blocks/opens a path through which a termination signal TERM being inputted to the input pad 702 is transferred to the sense amp drive unit 510, and opens the path when an output of the NOR gate 701 is LOW. And, an inverter 703 is illustrated in FIG. 7.

In an operation of the termination signal input unit, if any one of the pull-up sensing signal RTO_SENSING and the pull-down sensing signal SB_SENSING is inputted at a HIGH state, the output of the NOR gate 701 becomes LOW. Therefore, by turning off the first pass gate PG1 and turning on the second pass gate PG2, it becomes possible to input a signal to the input pad 702 via the path through which the termination signal is inputted, not the original path. Thus, if a HIGH signal is inputted to the input pad 702, the termination signal TERM is inputted at a HIGH state.

On the other hand, if both the pull-up sensing signal RTO_SENSING and the pull-down sensing signal SB_SENSING are LOW, the output of the NOR gate 701 becomes HIGH. Thus, because the first pass gate PG1 becomes on and the passgate 2 PG2 becomes off, an input signal to the input pad 702 is fed to its original path.

Now, effects of the memory device according to the present invention having the above-described configuration will be explained with reference to FIGS. 8 to 11.

Figure 9:
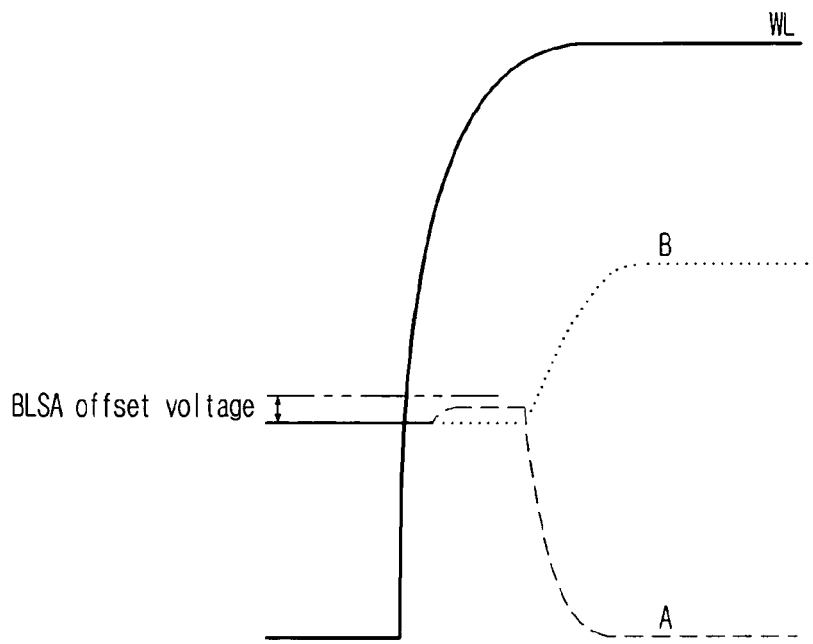

There can be many reasons for an error that occurs as opposite data are outputted during a read operation of the memory device. One of them is that a potential difference dV(delta V) between both ends of the bit line pair BL and /BL in result of charge sharing is less than the offset voltage of the bit line sense amp BLSA offset voltage. In this case, the bit line sense amp performs the sensing operation on the opposite data as shown in FIG. 9, and a read error occurs as a result.

Figure 8:
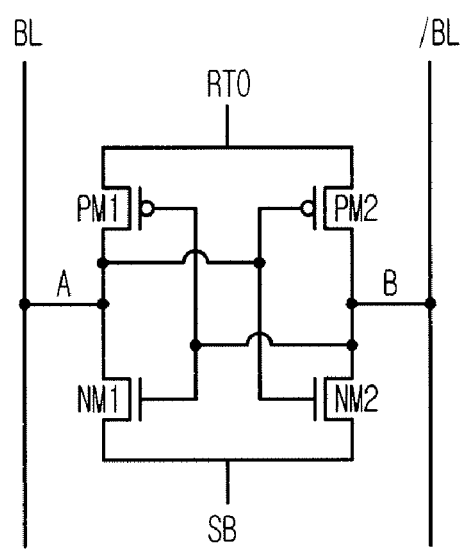
FIGS. 8 to 11 are diagrams for explaining the effects of the present invention.
Figure 10:
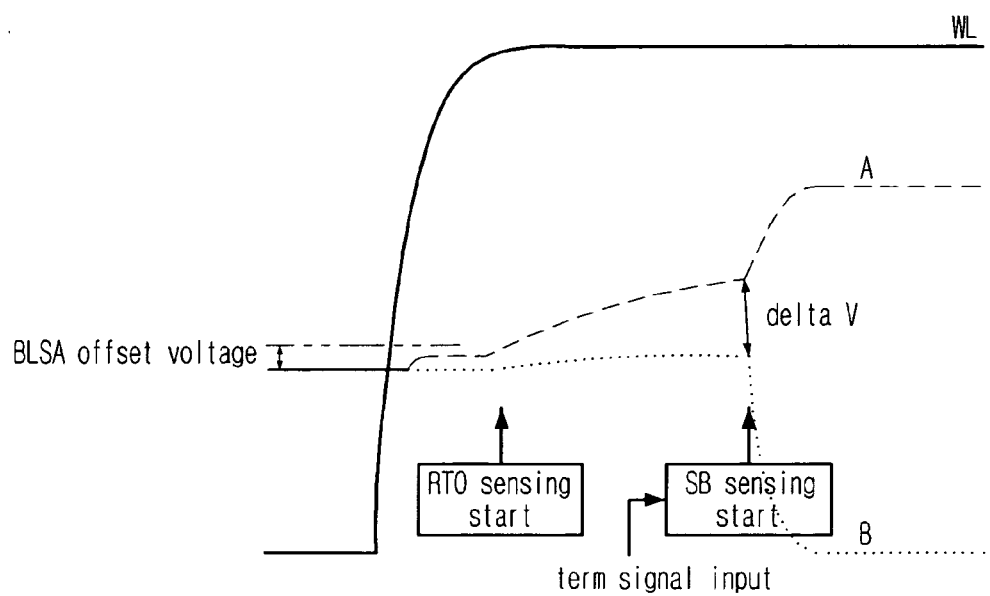

Further details will be provided referring to the cross coupled latches in the bit line sense amp shown in FIG. 8. When a sensing operation is carried out again after a read error occurred as shown in FIG. 9, the pull-up drive voltage RTO increases to a core voltage VCORE while the pull-down drive voltage SB is maintained to the precharge voltage VBLP when the pull-up sensing signal RTO_SENSING is applied. Therefore, only the sensing operation is done by the PM1 and PM2 transistors (hereinafter, referred to as PMOS sensing) shown in FIG. 8, but the sensing operation by the NM 1 and NM2 transistors (hereinafter, referred to as NMOS sensing) is not done (this is mainly because the VGS is close to 0). Suppose that a sufficient dV(delta V) is ensured during such a PMOS sensing and thus the termination signal TERM is applied to enable the sensing by all transistors PM 1 and PM2, and NM1 and NM2 (hereinafter, referred to as CMOS sensing). If a normal sensing operation as illustrated in FIG. 10 is achieved by this procedure, it may be concluded that an error during the read operation was caused by a mismatch in the NMOS transistor pair NM1 and NM2.

Figure 11:
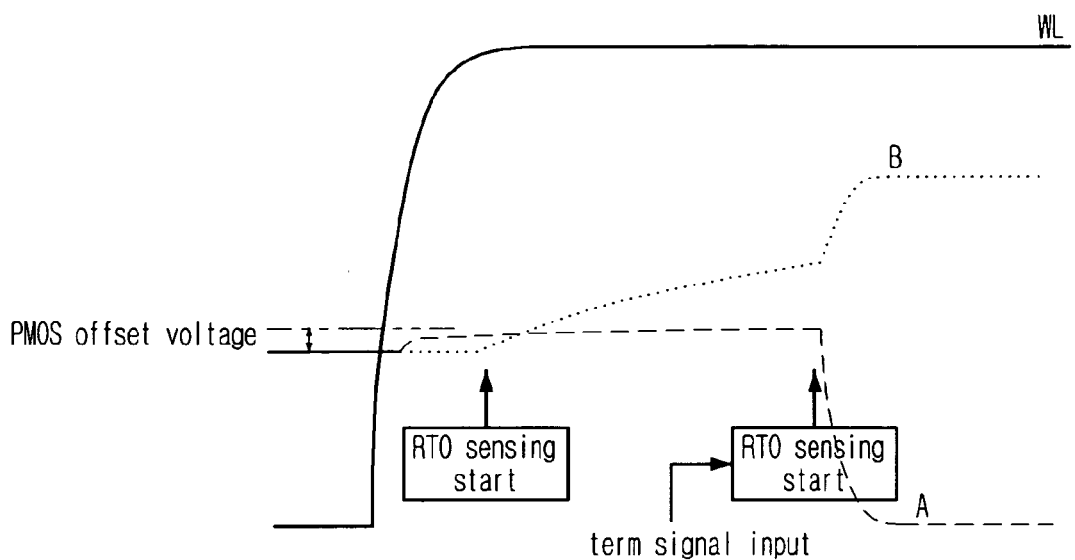

However, if there is still an error even after the PMOS sensing followed by the CMOS sensing, it may be concluded that the read error was caused by a mismatch in the PMOS transistor pair PM1 and PM2. That is to say, in case where a mismatch is in the PMOS transistor pair having a threshold voltage Vt of the PM1 transistor being higher than that of the PM2 transistor, as shown in FIG. 11, the PMOS sensing will rather invert electric potentials of the A and B nodes and the subsequent CMOS sensing will make the inverted potential difference larger, thereby resulting in a read error.

In short, the present invention enables the PMOS sensing only by the PMOS transistor pair PM1 and PM2 in the bit line sense amp, or enables the NMOS sensing only by the NMOS transistor pair NM1 and NM2 in the bit line sense amp. Therefore, when a read error occurs, it is possible to detect whether a mismatch is in the PMOS transistor pair or in the NMOS transistor pair by properly combining a start of the pull-up sensing signal RTO_SENSING, a start of the pull-down sensing signal SB_SENSING, and an input of the termination signal TERM.

Moreover, the present invention can also be used for Unlimited Sensing Margin Control (USMC) test. The USMC test checks if data is normally transferred by setting a time margin between a word line enable time by input of an active signal and a drive time of the bit line sense amp to be greater than a normal operation. Therefore, it is possible to do the USMC test by applying both the pull-up sensing signal RTO_SENSING and pull-down sensing signal SB_SENSING, and after a predetermined time without feeding both the pull-up drive voltage RTO and the pull-down drive voltage SB, by applying the termination signal TERM.

As set forth above, according to the present invention, because only one of the pull-up drive voltage RTO and the pull-down drive voltage SB can be supplied to the bit line sense amp, it becomes possible to detect whether an error during a read operation is caused by a mismatch in the PMOS transistor pair or by a mismatch in the NMOS transistor pair.

In addition, in case where both the pull-up sensing signal RTO_SENSING and the pull-down sensing signal SB_SENSING have been applied and then the termination signal TERM is applied after a predetermined time, the USMC test may also be done.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
    a sense amplifier configured to amplify a potential difference between a bit line pair; and
    a sense amplifier drive unit configured to supply the sense amplifier with a pull-up drive voltage and a pull-down drive voltage in response to a pull-up sensing test signal, a pull-down sensing test signal and a termination signal,
    wherein the sense amplifier drive unit does not supply the pull-down drive voltage when the pull-up sensing test signal is inputted, does not supply the pull-up drive voltage when the pull-down sensing test signal is inputted, and supplies the sense amplifier with both the pull-up drive voltage and the pull-down drive voltage regardless of the pull-up sensing test signal and pull-down sensing test signal when the termination signal is inputted.

2. The memory device as recited in claim 1, wherein the sense amplifier drive unit includes:
    a sense amplifier controller that does not output the pull-down drive signal when the pull-up sensing test signal is inputted and that does not output the pull-up drive signal when the pull-down sensing test signal is inputted; and
    a sense amplifier driver that supplies the pull-up drive voltage when the pull-up drive signal is inputted and the pull-down drive voltage when the pull-down drive signal is inputted.

3. The memory device as recited in claim 1, wherein the termination signal is inputted through an existing input pad.

4. The memory device as recited in claim 1, further comprising:
    a termination signal input unit to which the termination signal is inputted through a existing input pad when the pull-down sensing test signal or the pull-up sensing signal is inputted.

5. The memory device as recited in claim 4, wherein the termination signal input unit includes:
    a NOR gate configured to logically combine the pull-down sensing signal and the pull-up sensing signal;
    a first pass gate configured to transmit a signal outputted from the existing input pad as an original signal in response to an output of the NOR gate; and
    a second pass gate configured to transmit the signal outputted from the existing input pad as the termination signal in response to the output of the NOR gate.

6. The memory device as recited in claim 1, wherein the sense amplifier controller includes:
    a first NOR gate to which an pull-up drive signal carrying line and the pull-down sensing test signal are inputted; and
    a second NOR gate to which an pull-down drive signal carrying line and the pull-up sensing test signal are inputted.

7. The memory device as recited in claim 6, wherein the sense amplifier controller further includes:
    a third NOR gate to which an output of the first NOR gate and the termination signal are inputted; and
    a fourth NOR gate to which an output of the second NOR gate and the termination signal are inputted.

8. The memory device of claim 1, wherein the sense amplifier includes:
    a first PMOS transistor connected between an input terminal of the pull-up drive voltage and a first bit line, whose gate is connected to a second bit line;
    a second PMOS transistor connected between the input terminal of the pull-up drive voltage and the second bit line, whose gate is connected to the second bit line;
    a first NMOS transistor connected between the first bit line and an input terminal of the pull-down drive voltage, whose gate is connected to the first bit line; and
    a second NMOS transistor connected between the second bit line and the input terminal of the pull-down drive voltage, whose gate is connected to the second bit line.

* * * * *